US011585835B2

(12) United States Patent
Arunachalam et al.

(10) Patent No.: US 11,585,835 B2
(45) Date of Patent: Feb. 21, 2023

(54) SYSTEM OF DETERMINING THE SEQUENCE AND POSITIONING OF PLUGGABLE MODULES

(71) Applicant: RED LION CONTROLS, INC., York, PA (US)

(72) Inventors: Karthikeyan Arunachalam, York, PA (US); Ramakrishnan Vijayakumar, York, PA (US)

(73) Assignee: RED LION CONTROLS, INC., York, PA (US)

( * ) Notice: Subject to any disclaimer, the term of this patent is extended or adjusted under 35 U.S.C. 154(b) by 72 days.

(21) Appl. No.: 17/150,409

(22) Filed: Jan. 15, 2021

(65) Prior Publication Data

US 2022/0229092 A1  Jul. 21, 2022

(51) Int. Cl.
*G01R 11/04* (2006.01)
*G01R 22/06* (2006.01)

(52) U.S. Cl.
CPC ............ *G01R 11/04* (2013.01); *G01R 22/065* (2013.01)

(58) Field of Classification Search
CPC ......... G01R 11/00; G01R 11/02; G01R 11/04; G01R 22/06; G01R 22/061; G01R 22/065
See application file for complete search history.

(56) References Cited

U.S. PATENT DOCUMENTS

| | | | |
|---|---|---|---|
| 4,647,123 A * | 3/1987 | Chin | G06F 13/409 711/E12.088 |
| 6,516,377 B1 * | 2/2003 | Brinkhus | G06F 12/0676 710/305 |
| 6,775,726 B2 | 8/2004 | Chong | |
| 6,787,939 B2 * | 9/2004 | Reichard | H02J 1/001 307/150 |
| 8,704,509 B2 | 4/2014 | Neal et al. | |
| 10,067,168 B2 | 9/2018 | Suchoff | |
| 2005/0289274 A1 * | 12/2005 | Ghercioiu | G06F 8/51 710/303 |
| 2006/0057760 A1 * | 3/2006 | Yi | H01L 27/14687 438/57 |
| 2009/0083446 A1 * | 3/2009 | Konieczny | G05B 19/052 710/2 |
| 2016/0313382 A1 * | 10/2016 | Suchoff | G01R 21/133 |
| 2018/0225230 A1 * | 8/2018 | Litichever | G06F 13/107 |
| 2021/0307189 A1 * | 9/2021 | Lucero | H05K 7/1422 |

FOREIGN PATENT DOCUMENTS

| | | |
|---|---|---|
| CN | 104243256 A | 12/2014 |
| CN | 204119260 | 1/2015 |
| CN | 108508876 A | 5/2018 |
| JP | 2012122849 A | 6/2012 |
| WO | 2020209862 A1 | 10/2020 |

* cited by examiner

*Primary Examiner* — Huy Q Phan
*Assistant Examiner* — David B Frederiksen
(74) *Attorney, Agent, or Firm* — Potomac Law Group, PLLC; Bruce Wolstoncroft

(57) ABSTRACT

A system having a host unit and a plurality of stacked modules which are electrically connected to the host unit. The host unit communicates with the plurality of stacked modules through a RS-485 interface. Upon power up, each module of the plurality of stacked modules is powered and enumerated in sequence, allowing the host unit to know the sequence the plurality of stable modules are connected.

13 Claims, 4 Drawing Sheets

SYSTEM OF DETERMINING THE SEQUENCE AND POSITIONING OF PLUGGABLE MODULES

FIELD OF THE INVENTION

The present invention is directed a system that is adapted to identify the location and function of modules connected in a daisy chain to a host unit.

BACKGROUND OF THE INVENTION

Many systems and devices, such as a panel meter for machine controls required modules to be added and electrically connected to a host unit to allow for functionality to be added to the host unit. The modules allow for customization of the system.

However, as modules are added, the host unit does not know the positioning of the modules. Consequently, the communication between the modules and the host unit is inefficient. In addition, as the host unit does not know the positioning of the modules, the host unit cannot determine the last module in the chain resulting in the inability to terminate the data lines which in turn results in poor signal integrity. In addition, hot plugging modules cannot be prevented.

It would be beneficial to know the last module in the stack to allow the termination to be applied to the data lines for better signal integrity and disabling hot plugging modules by activating the reset-out line of the last module. It would also be beneficial to provide a system which overcomes the deficiencies of the know art, allowing the host unit to determine the exact sequence and location of the modules, and to provide a system in which the host unit can determine proper termination of the signal line for better signal integrity.

SUMMARY OF THE INVENTION

An embodiment is directed to a system having a host unit and a plurality of stacked modules which are electrically connected to the host unit. The host unit communicates with the plurality of stacked modules through a RS-485 interface. Upon power up, each module of the plurality of stacked modules is powered and enumerated in sequence, allowing the host unit to know the sequence the plurality of stable modules are connected.

An embodiment is directed to a host unit and a plurality of stacked modules electrically connected to the host unit. The host unit communicates with the stacked modules through the RS-485 interface. A reset line extends from the host unit. The reset line is daisy chained to the stacked modules. In use, a reset signal from the host unit is sent to the plurality of stacked modules sequentially, wherein upon power up, each module of the plurality of stacked modules is powered and enumerated in sequence, allowing the host unit to know the sequence the plurality of stacked modules are connected.

An embodiment is directed to a system having a host unit and a plurality of modules electrically connected to the host unit. A power line extends from the host unit. The power line is electrically connected to each of the modules of the plurality of modules. A signal line extends from the host unit. The signal line is electrically connected to each of the modules of the plurality of modules. A first reset line extends from the host unit. The first reset line is electrically connected to a first module of the plurality of modules. A second reset line extends from the first module of the plurality of modules. The second reset line is electrically connected to a second module of the plurality of modules. A reset signal from the host unit is sent to the first module to enumerate the first module. When the first module is released from reset, the reset signal is sent from the first module to the second module to enumerate the second module. Only one module of the plurality of modules is active during an enumeration period.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

Figure 1:
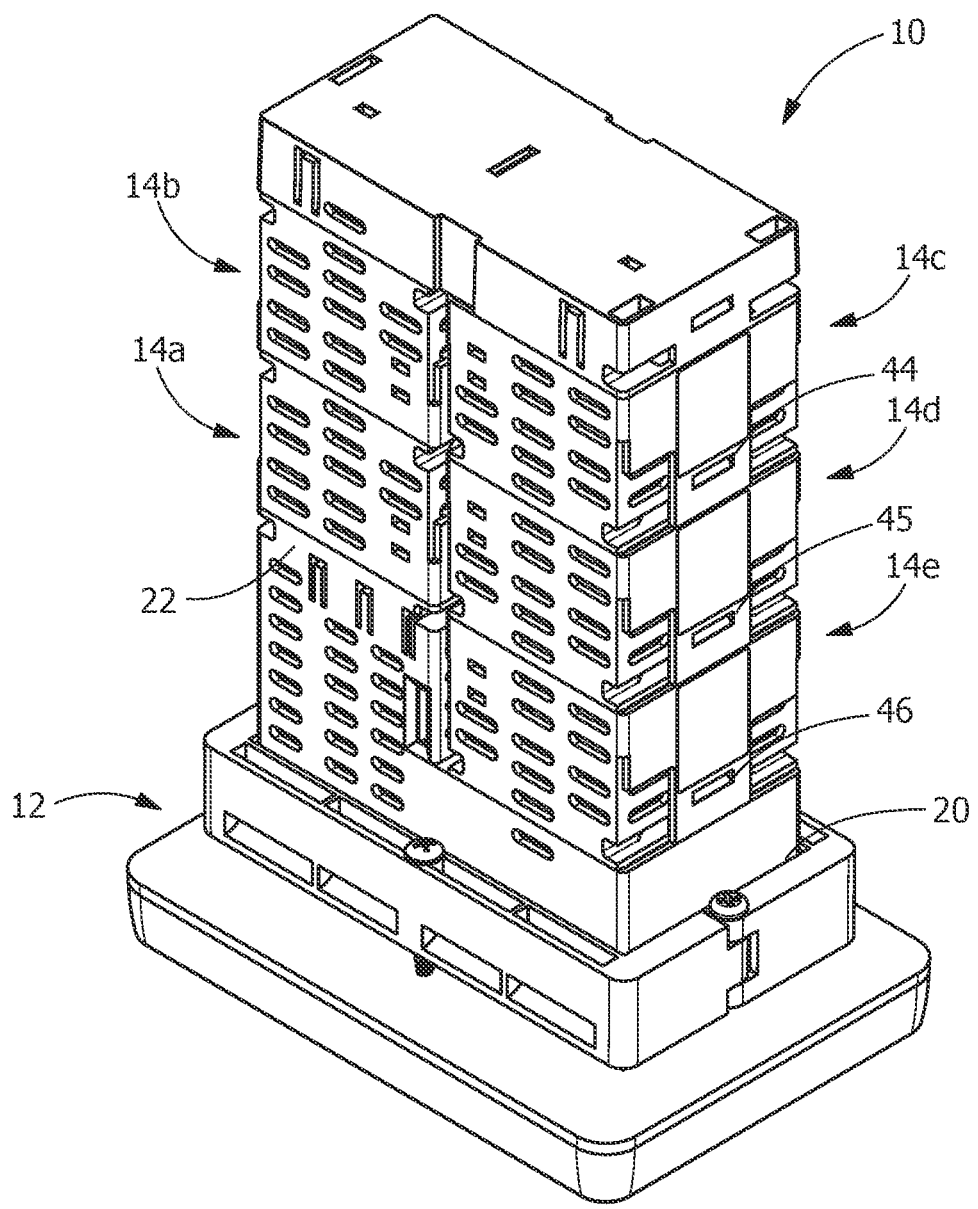
FIG. 1 is a perspective view of an illustrative embodiment of a system according to the present, the illustrative system has five modules electrically connected to a host unit.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

Figure 2:
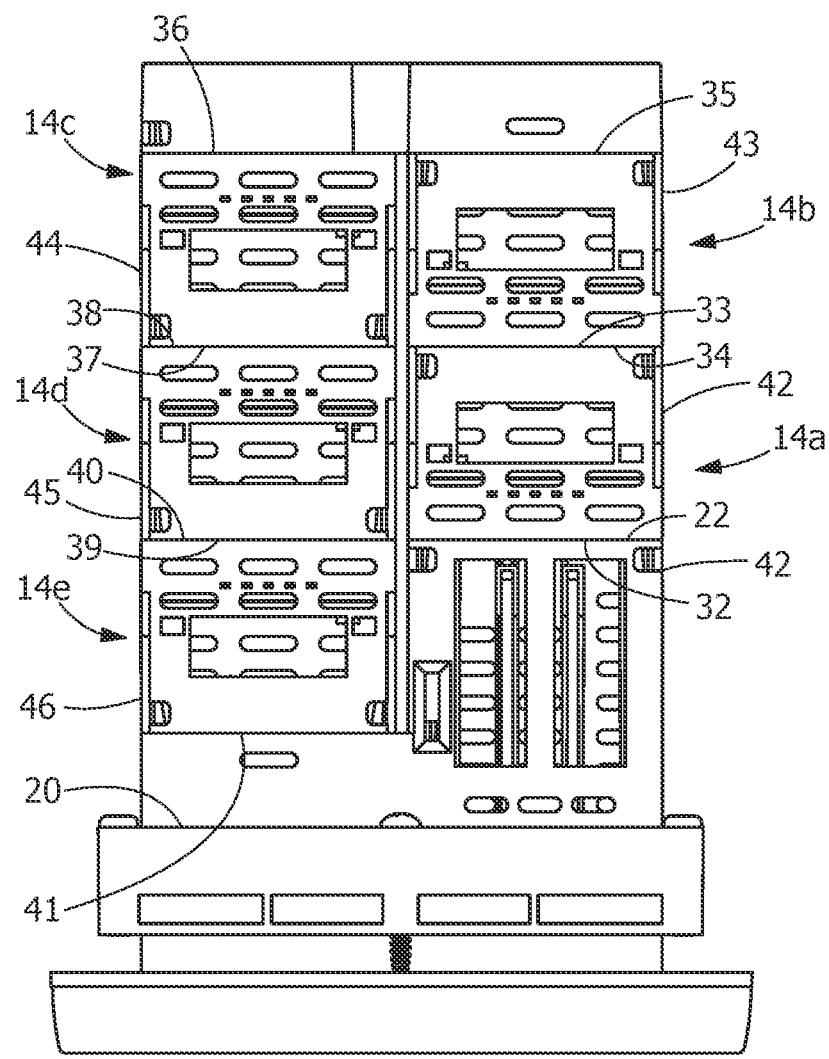
FIG. 2 is a front view of the system as shown in FIG. 1.

As shown in FIGS. 1 and 2, the illustrative system 10 includes a host unit 12 and a plurality of pluggable modules 14 which are stacked or daisy chained to be in electrical connection with the host unit. In the illustrative embodiment, five modules 14 are shown, however, other numbers of modules 14 may be used.

Figure 3:
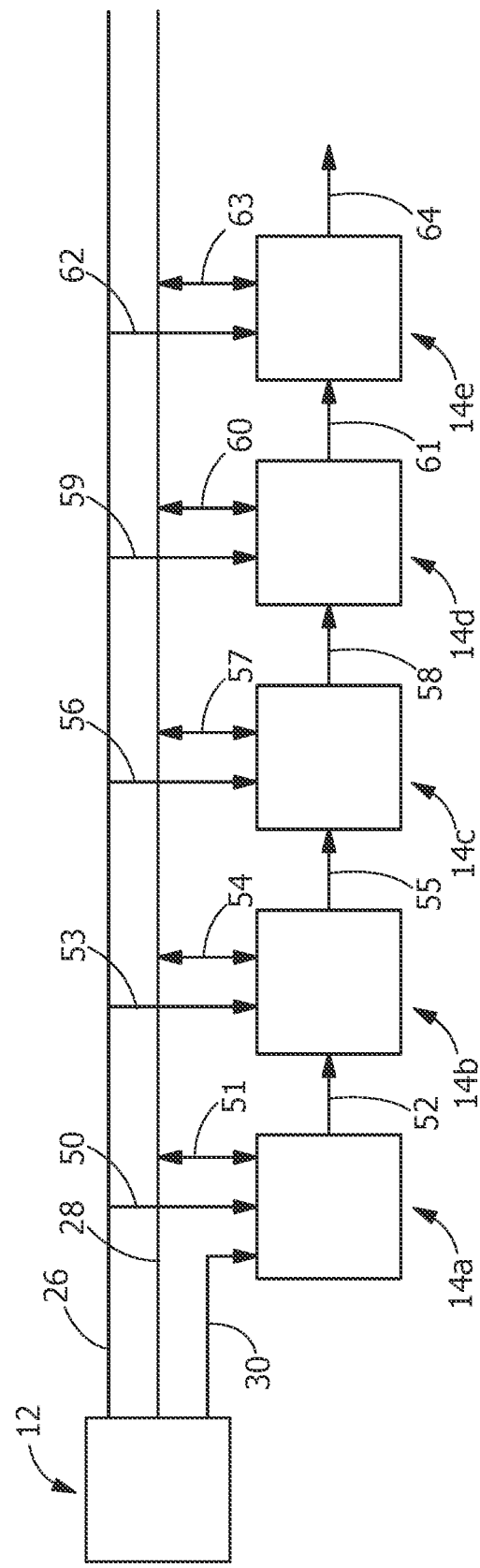
FIG. 3 is a diagrammatic view showing circuitry between the host unit and the modules.

The illustrative host unit 12 has a backplane interface 20 with a module receiving area 22 for receiving a first module 14a therein. As shown in FIG. 3, the host unit 12 has power lines or terminals 26, signal lines or terminals 28 and reset lines or terminals 30 extending therethrough. The host unit 12 may have latches provided thereon.

An example of the host unit 12 is a panel meter used on machine controls. The signal line 26 may be, but is not limited to, an RS-485 communication line. In the illustrative embodiment, the host unit 12 is an RS-485 leader and the modules 14 are RS-485 followers.

The first stacked module 14a has a first mating face 32 and an oppositely facing second mating face 33. Power lines or terminals 50, signal lines or terminals 51 and reset lines or terminals 52 are provided in the first module 14a.

A second stacked module 14b has a first mating face 34 and an oppositely facing second mating face 35. Power lines or terminals 53, signal lines or terminals 54 and reset lines or terminals 55 are provided in the third module 14b.

A third stacked module 14c has a first mating face 36 and an oppositely facing second mating face 37. Power lines or terminals 56, signal lines or terminals 57 and reset lines or terminals 58 are provided in the third module 14c.

A fourth stacked module 14d has a first mating face 38 and an oppositely facing second mating face 39. Power lines or terminals 59, signal lines or terminals 60 and reset lines or terminals 61 are provided in the third module 14d.

A fifth stacked module 14e has a first mating face 40 and an oppositely facing second mating face 41. Power lines or terminals 62, signal lines or terminals 63 and reset lines or terminals 64 are provided in the third module 14e.

Additional stacked modules (not shown) may also be provided. The additional modules may have similar configurations to the modules described. The modules 14 are provided to add functionality to the host unit 12. Examples of options for the modules 14 include, but are not limited to module which are directed to Ethernet, Analog Output, RS-232 Serial, and Relay functions.

One or more latches 42 may be provided on the first module 14a to hold the first module 14a in position relative to the module receiving area 22 of the host unit 12 and to cooperate with the second module 14b. Various configurations of the latches 42 may be used based on the configuration of the host unit 12 and the module 14.

As shown in FIGS. 2 and 3, the first mating face 32 of the first module 14a is provided in mechanical and electrical engagement with the mating face 24 of the module receiving area 22 of the host unit 12. When properly inserted onto the mating face 24, the power lines or terminals 50, the signal lines or terminals 51 and the reset lines or terminals 52 of the first module 14a are provided in electrical engagement with the respective power lines or terminals 26, signal lines or terminals 28 and reset lines or terminals 30 of the host unit 12. When properly inserted, the latches 42 cooperates with the first module 14a and the host unit 12 to retain the module 14a in proper position relative to the host unit 12.

One or more latches 43 may be provided on the second module 14b to hold the second module 14b in position relative to the first module 14a and relative to the third module 14c. Various configurations of the latches 43 may be used.

As shown in FIGS. 2 and 3, the first mating face 34 of the second module 14b is provided in mechanical and electrical engagement with the mating face 33 of the first module 14a. When properly inserted onto the mating face 33, the power lines or terminals 53 and the signal lines or terminals 54 of the second module 14b are provided in electrical engagement, either directly or indirectly with the respective power lines or terminals 26 and the signal lines or terminals 28. In addition, the reset lines or terminals 55 are provided in electrical engagement with the reset lines or terminals 52 of the first module 14a and indirectly with the reset lines or terminals 30 of the host unit 12.

One or more latches 44 may be provided on the third module 14c to hold the third module 14c in position relative to the second module 14b and relative to the fourth module 14d. Various configurations of the latches 44 may be used.

As shown in FIGS. 2 and 3, the first mating face 36 of the third module 14c is provided in mechanical and electrical engagement with the mating face 35 of the second module 14b. When properly inserted onto the mating face 35, the power lines or terminals 56 and the signal lines or terminals 57 of the third module 14c are provided in electrical engagement, either directly or indirectly with the respective power lines or terminals 26 and the signal lines or terminals 28. In addition, the reset lines or terminals 58 are provided in electrical engagement with the reset lines or terminals 55 of the second module 14b and indirectly with the reset lines or terminals 30 of the host unit 12.

One or more latches 45 may be provided on the fourth module 14d to hold the fourth module 14d in position relative to the third module 14c and relative to the fifth module 14e. Various configurations of the latches 45 may be used.

As shown in FIGS. 2 and 3, the first mating face 38 of the fourth module 14d is not provided in mechanical engagement with the third module 14c, but the fourth module 14d is provided in electrical engagement with the third module 14c. Although in other embodiments, the third module 14c and fourth module 14d may be provided in mechanical engagement. When properly positioned, the power lines or terminals 59 and the signal lines or terminals 60 of the fourth 14d are provided in electrical engagement, either directly or indirectly with the respective power lines or terminals 26 and the signal lines or terminals 28. In addition, the reset lines or terminals 61 are provided in electrical engagement with the reset lines or terminals 58 of the third module 14c and indirectly with the reset lines or terminals 30 of the host unit 12.

One or more latches 46 may be provided on the fifth module 14e to hold the fifth module 14e in position relative to the fourth module 14d. Various configurations of the latches 46 may be used.

As shown in FIGS. 2 and 3, the first mating face 40 of the fifth module 14e is provided in mechanical and electrical engagement with the mating face 39 of the fourth module 14d. When properly inserted onto the mating face 39, the power lines or terminals 62 and the signal lines or terminals 63 of the fifth 14e are provided in electrical engagement, either directly or indirectly with the respective power lines or terminals 26 and the signal lines or terminals 28. In addition, the reset lines or terminals 64 are provided in electrical engagement with the reset lines or terminals 61 of the fourth module 14d and indirectly with the reset lines or terminals 30 of the host unit 12.

Additional modules can be added as needed. The process of adding additional modules is similar to that stated above. The first module 14a, the second module 14b, the third module 14c, the fourth module 14d, the fifth module 14e and additional modules are stacked and connected in a daisy chain manner.

Figure 4:
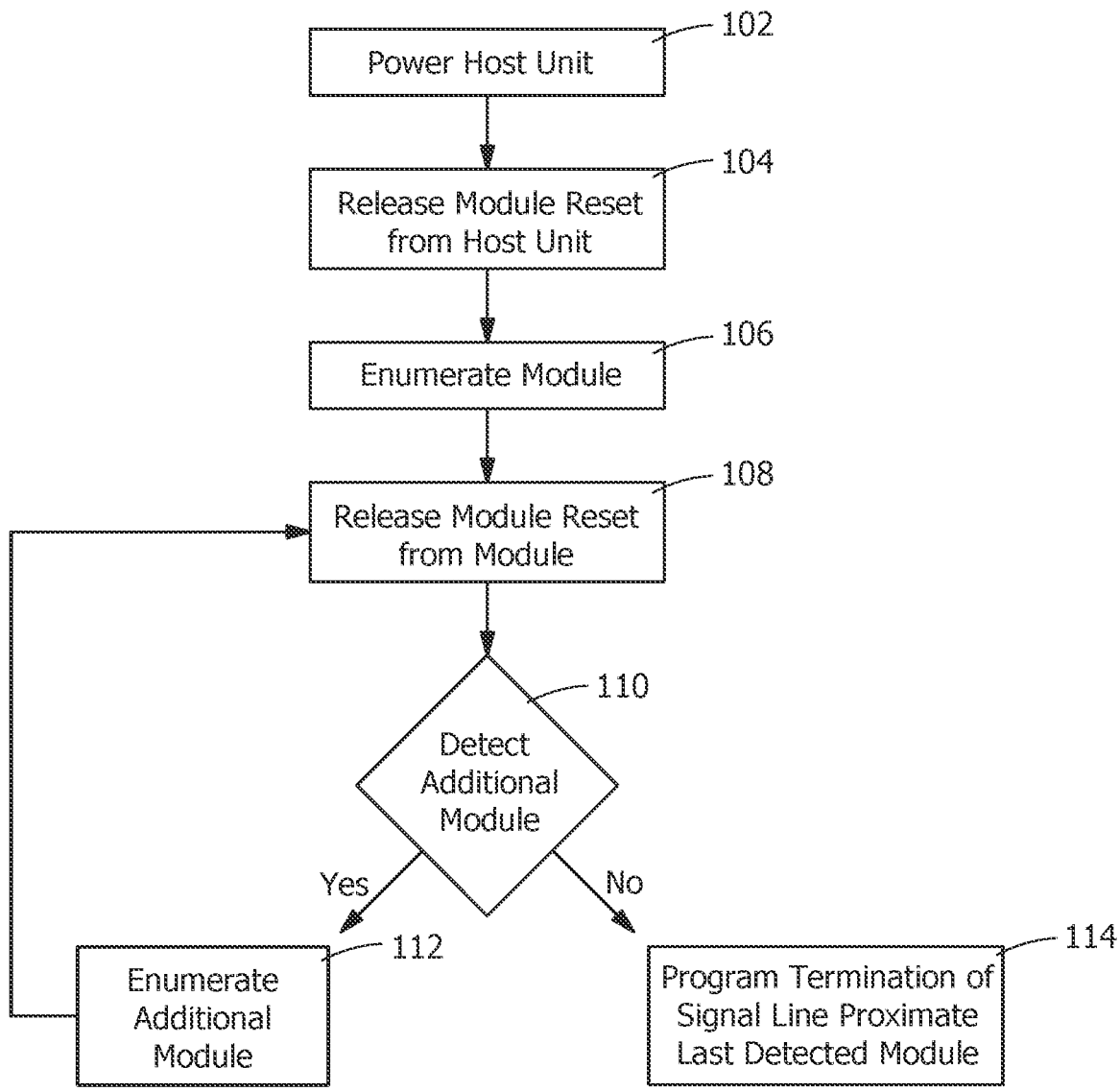
FIG. 4 is a flow diagram of the method of enumeration sequence of the modules.

As shown in FIG. 4, with the modules properly positioned and secured, the host unit 12 is powered up, as shown at 102. Upon power up, the host unit 12 completes the boot-up process. During this process, the reset signal is held low and the application in the host unit 12 is started. Once the application is running, the host releases the module reset on reset line 30, allowing the module reset to the first module 14a to go high, thereby issuing a reset signal to first module 14a through the reset line 30, as shown at 104. This allows the first module 14a to wake-up and be enumerated during a first enumeration period, as shown at 106. During the first enumeration of the first module 14a, information is sent from the first module 14a to the host unit 12 through the signal lines 51, 28, allowing the host unit 12 to know the location and function of the first module 14a in the daisy chain.

After the first enumeration period is ended and the first module 14a is released from reset, as shown at 108, the first module 14a issues a reset signal to the second module 14b through the reset line 52. If a second module 14b is detected, as shown at 110, the second module 14b wakes-up and is enumerated during a second enumeration period, as shown at 112. During the second enumeration of the second module 14b, information is sent from the second module 14b to the host unit 12 through the signal lines 54, 28, allowing the host unit 12 to know the location and function of the second module 14b in the daisy chain.

After the second enumeration period is ended and the second module 14b is released from reset, as shown at 108, the second module 14b issues a reset signal to the third module 14c through the reset line 55. If a third module 14c is detected, as shown at 110, the third module 14c wakes-up and is enumerated during a third enumeration period, as shown at 112. During the third enumeration of the third module 14c, information is sent from the third module 14c to the host unit 12 through the signal lines 57, 28, allowing the host unit 12 to know the location and function of the third module 14c in the daisy chain.

After the third enumeration period is ended and the third module 14c is released from reset, as shown at 108, the third module 14c issues a reset signal to the fourth module 14d through the reset line 58. If a fourth module 14d is detected, as shown at 110, the fourth module 14d wakes-up and is enumerated during a fourth enumeration period, as shown at 112. During the fourth enumeration of the fourth module 14d, information is sent from the fourth module 14d to the host unit 12 through the signal lines 60, 28, allowing the host unit 12 to know the location and function of the fourth module 14d in the daisy chain.

After the fourth enumeration period is ended and the fourth module 14d is released from reset, as shown at 108, the fourth module 14d issues a reset signal to the fifth module 14e through the reset line 61. If a fifth module 14e is detected, as shown at 110, the fifth module 14e wakes-up and is enumerated during a fifth enumeration period, as shown at 112. During the fifth enumeration of the fifth module 14e, information is sent from the fifth module 14e to the host unit 12 through the signal lines 63, 28, allowing the host unit 12 to know the location and function of the fifth module 14e in the daisy chain.

The enumeration of any addition modules attached in the daisy chain occur in the same manner. At the end of this process, the reset terminal or line for the last module in the daisy chain, which is not connected to additional rest terminal or line, is pulled low which will prevent additional modules from being added (hot plugged) without following the enumeration process.

The process of enumeration continues until a respective module does not detect an adjacent module during reset, as shown at 114. If no adjacent module is detected, the respective module assumes that it is the last module in the chain and sends a message to the host unit 12 that no additional modules are present. As this occurs, the signal line 28 is electronically terminated proximate the last module to minimize signal interference on the signal line 28 and allow for higher baud rate communication over the signal line 28 after the enumeration process Because the reset terminals or lines are daisy changed, this system 10 ensures that only one module is active at a time until all of the modules are enumerated. At the end of enumeration, the host unit 12 knows the physical location of each module 14 in the daisy chain. At the end of enumeration, the host unit 12 knows how many modules 14 are connected, thereby allowing the host unit 12 to know the last module in the chain, thereby allowing the host unit 12 to program the termination of the signal line at the proper location at the end of the last module for better signal integrity through the host unit 12. In addition, the reset line for the last module is pulled low which will prevent additional modules from being added (hot plugged) without following the enumeration process.

As stated above, upon power up, each module 14 wakes up in sequence and gets enumerated in sequence. The host unit 12 knows the exact sequence the modules 14 are connected and applies the proper termination on the signal lines for the last module in the chain. The system 10 provides a simple and inexpensive method to determine the identity of modules or computer peripheral devices that are coupled to the host unit 12 or computer system in a daisy chain configuration.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

We claim:

1. A system comprising:
  a host unit;
  a plurality of stacked modules electrically connected to the host unit;
  the host unit communicates with the plurality of stacked modules through a RS-485 interface;
  a first reset line extending from the host unit, the first reset line being electrically connected to a first module of the plurality of stacked modules;
  a second reset line extending from the first module of the plurality of stacked modules, the second reset line being electrically connected to a second module of the plurality of stacked modules;
  wherein upon power up, each module of the plurality of stacked modules is enumerated in sequence, allowing the host unit to know the sequence the plurality of stacked modules are connected.

2. The system as recited in claim 1, wherein an RS-485 signal line extends from the host unit, the signal line being electrically connected to each of the modules of the plurality of modules, wherein the host unit applies a proper termination on the RS-485 signal line for a last module of the plurality of stacked modules.

3. The system as recited in claim 2, wherein a power line extends from the host unit, the power line being electrically connected to each of the modules of the plurality of stacked modules.

4. The system as recited in claim 2, wherein a reset signal from the host unit is sent to the first module to enumerate the first module.

5. The system as recited in claim 4, wherein when the first module is released from reset, the reset signal is sent from the first module to the second module to enumerate the second module.

6. The system as recited in claim 2, wherein at the end of enumeration, the host unit knows the physical location of each of the modules of the plurality of modules in a daisy chain and how many modules are connected to the host, allowing the host unit to know the position of the last module in the daisy chain, wherein the host unit programs the termination of the signal line at the proper location at the end of the last module for better signal integrity through the host unit.

7. The system as recited in claim 1, wherein only one module of the plurality of stacked modules is active during an enumeration period.

8. The system as recited in claim 1, wherein a reset line for a last module of the plurality of modules is pulled low to prevent additional modules from being added without following the enumeration process.

9. A system comprising:
a host unit;
a plurality of modules electrically connected to the host unit;
a power line extending from the host unit, the power line being electrically connected to each of the modules of the plurality of modules;
a signal line extending from the host unit, the signal line being electrically connected to each of the modules of the plurality of modules;
a first reset line extending from the host unit, the first reset line being electrically connected to a first module of the plurality of modules;
a second reset line extending from the first module of the plurality of modules, the second reset line being electrically connected to a second module of the plurality of modules;
wherein a reset signal from the host unit is sent to the first module to enumerate the first module;
wherein when the first module is released from reset, the reset signal is sent from the first module to the second module to enumerate the second module;
wherein only one module of the plurality of modules is active during an enumeration period.

10. The system as recited in claim 9, wherein the host unit has a backplane interface.

11. The system as recited in claim 9, wherein the signal line is an RS-485 communication line.

12. The system as recited in claim 9, wherein at the end of enumeration, the host unit knows the physical location of each module of the plurality of modules, allowing the host unit to know the position of a last module of the plurality of modules, wherein the host unit programs the termination of the signal line at the proper location at the end of the last module of the plurality of modules for better signal integrity through the host unit.

13. The system as recited in claim 9, wherein the reset line for a last module the plurality of modules is pulled low to prevent additional modules from being added without following the enumeration process.

* * * * *